(12) United States Patent
Yeh et al.

(10) Patent No.: US 10,537,040 B1
(45) Date of Patent: Jan. 14, 2020

(54) CHASSIS

(71) Applicant: Wiwynn Corporation, New Taipei (TW)

(72) Inventors: Ping-Sheng Yeh, New Taipei (TW); Yan-Yu Chen, New Taipei (TW); Ming-Feng Hsieh, New Taipei (TW); Hung-Lung Lin, New Taipei (TW); Chia-Hsin Hsieh, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/275,330

(22) Filed: Feb. 14, 2019

(30) Foreign Application Priority Data

Jan. 19, 2019 (TW) .............................. 108102123 A

(51) Int. Cl.
| | |
|---|---|
| *H05K 7/14* | (2006.01) |
| *G06F 1/16* | (2006.01) |
| *A47B 88/90* | (2017.01) |
| *G06F 1/18* | (2006.01) |

(52) U.S. Cl.
CPC ......... *H05K 7/1489* (2013.01); *A47B 88/941* (2017.01); *G06F 1/187* (2013.01); *H05K 7/1487* (2013.01)

(58) Field of Classification Search
CPC ............. H05K 7/1489; H05K 7/14787; H05K 7/1487; G06F 1/187
See application file for complete search history.

(56) References Cited

U.S. PATENT DOCUMENTS

| | | | | |
|---|---|---|---|---|
| 8,534,777 | B2 * | 9/2013 | Gong ..................... | G06F 1/187 312/223.2 |
| 8,596,472 | B2 * | 12/2013 | Yin ...................... | H05K 7/1489 211/26 |
| 8,616,662 | B2 * | 12/2013 | Yin ...................... | H05K 7/1489 312/223.2 |
| 9,930,804 | B2 * | 3/2018 | Lu ........................ | H05K 7/1488 |
| 10,061,362 | B2 * | 8/2018 | Jau ......................... | G06F 1/187 |
| 10,091,905 | B1 * | 10/2018 | Konovalov .......... | H05K 7/1489 |
| 2012/0242203 | A1 * | 9/2012 | Gong ..................... | G06F 1/187 312/223.2 |
| 2013/0087518 | A1 * | 4/2013 | He ....................... | H05K 7/1489 211/26 |

(Continued)

FOREIGN PATENT DOCUMENTS

TW M571108 12/2018

*Primary Examiner* — Kimberley S Wright
(74) *Attorney, Agent, or Firm* — Winston Hsu

(57) ABSTRACT

A chassis includes a housing, a partition, a movable member and a tray. The housing includes a top plate and a bottom plate, and the top plate is opposite to the bottom plate. An accommodating space is located between the top plate and the bottom plate. The bottom plate has a through hole. The partition is disposed in the accommodating space. The movable member is connected to the partition. The movable member is configured to move between a first position and a second position. The tray includes a latch member. When the movable member is located at the first position and the tray is placed into the accommodating space, the movable member is embedded into the through hole and the latch member engages with the movable member. When the movable member is located at the second position, the movable member disengages from the through hole.

10 Claims, 18 Drawing Sheets

(56) References Cited

U.S. PATENT DOCUMENTS

| | | | |
|---|---|---|---|
| 2013/0092644 A1* | 4/2013 | Yin | H05K 7/1489 211/26 |
| 2013/0093302 A1* | 4/2013 | Yin | H05K 7/1489 312/223.2 |
| 2015/0092339 A1* | 4/2015 | Li | G06F 1/187 361/679.39 |
| 2015/0192970 A1* | 7/2015 | Jau | G06F 1/187 361/679.33 |
| 2018/0054908 A1* | 2/2018 | Lu | H05K 7/1488 |
| 2018/0288895 A1* | 10/2018 | Konovalov | H05K 7/1489 |

\* cited by examiner

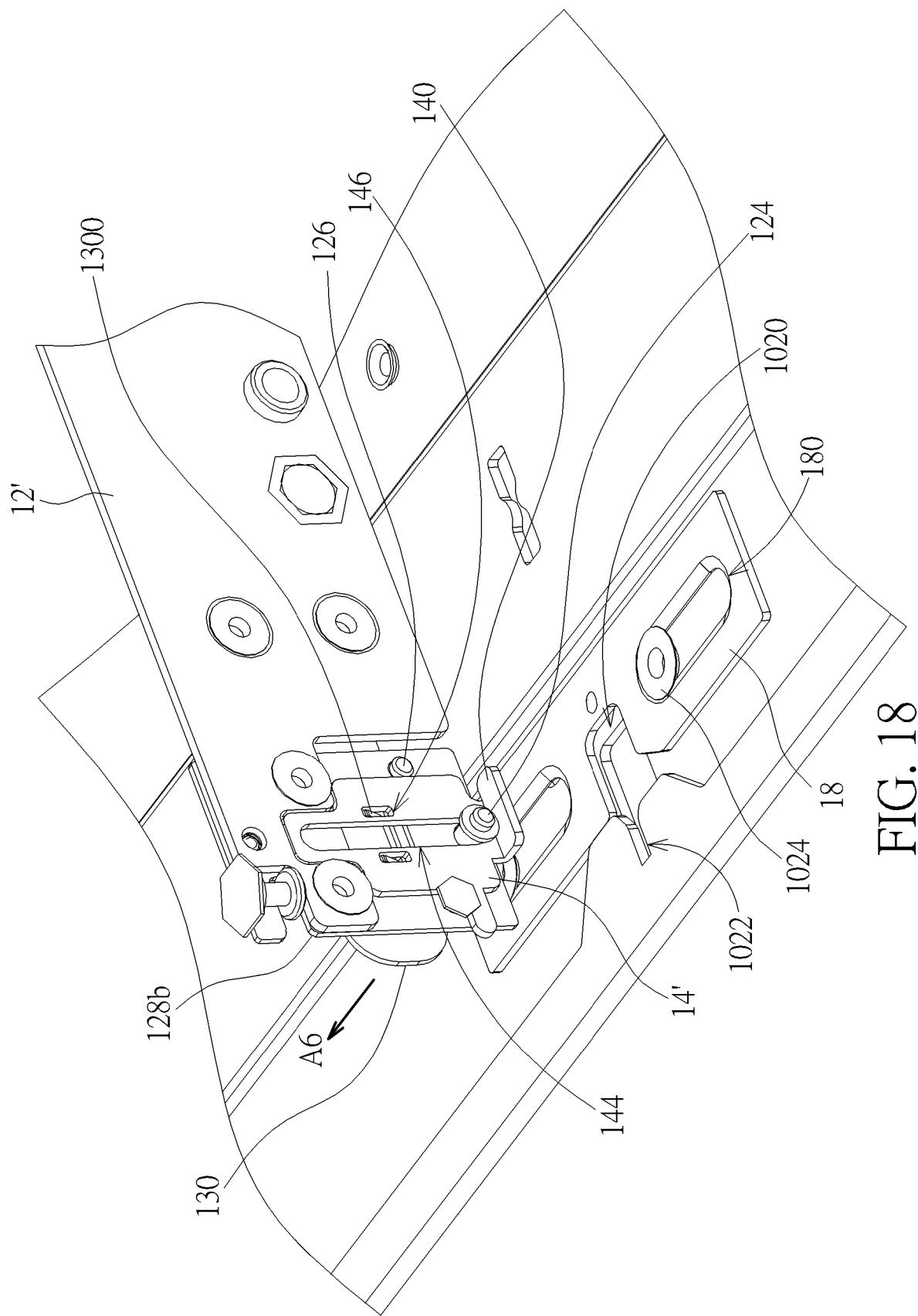

CHASSIS

BACKGROUND OF THE DISCLOSURE

1. Field of the Disclosure

The disclosure relates to a chassis and, more particularly, to a chassis using a movable member to adjust a size of an accommodating space.

2. Description of the Prior Art

A server is used to serve various computers or portable electronic devices in network system. In general, a tray is disposed in a chassis of the server to accommodate various electronic components (e.g. hard disc, graphics card, etc.). Furthermore, for different servers with different functions, the sizes of the needed trays are different correspondingly. Therefore, a manufacturer has to design different chassis for accommodating different trays with different sizes, such that the manufacture cost increases.

SUMMARY OF THE DISCLOSURE

The disclosure provides a chassis using a movable member to adjust a size of an accommodating space, so as to solve the aforesaid problems.

According to an embodiment of the disclosure, a chassis includes a housing, a partition, a movable member and a tray. The housing includes a top plate and a bottom plate, wherein the top plate is opposite to the bottom plate. An accommodating space is located between the top plate and the bottom plate. The bottom plate has a through hole. The partition is disposed in the accommodating space. The movable member is connected to the partition. The movable member is configured to move between a first position and a second position. The tray includes a latch member. When the movable member is located at the first position and the tray is placed into the accommodating space, the movable member is embedded into the through hole and the latch member engages with the movable member. When the movable member is located at the second position, the movable member disengages from the through hole.

As mentioned in the above, a user may move the movable member to the first position to reduce the accommodating space, so as to accommodate a tray with a small size. At this time, the tray may be fixed in the accommodating space by the engagement between the movable member and the latch member of the tray. Furthermore, the user may move the moveable member to the second position to enlarge the accommodating space, so as to accommodate another tray with a large size. Since a manufacture does not need to design different chassis for different trays with different sizes, the manufacture cost can be saved effectively.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

FIG. 18 is a perspective view illustrating the movable member shown in FIG. 17 after moving.

DETAILED DESCRIPTION

Figure 1:
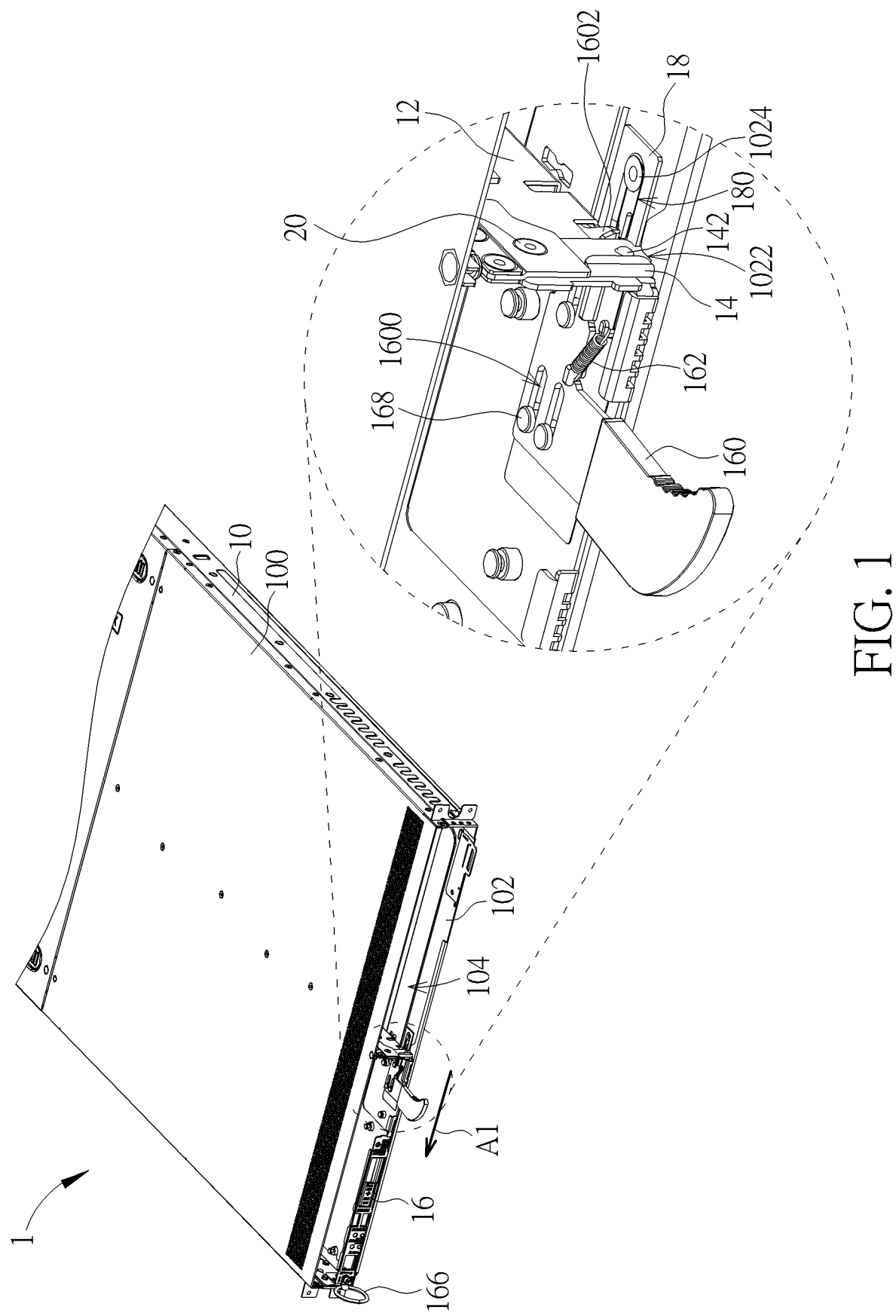
FIG. 1 is a perspective view illustrating a chassis according to an embodiment of the disclosure.

As shown in FIGS. 1 to 6, a chassis 1 includes a housing 10, a partition 12, a movable member 14, a tray 16 and a sliding member 18. In this embodiment, the chassis 1 may be, but not limited to, a chassis of a server. The tray 16 may be used to accommodate various electronic components (e.g. hard disc, graphics card, etc.) according to practical applications.

Figure 2:
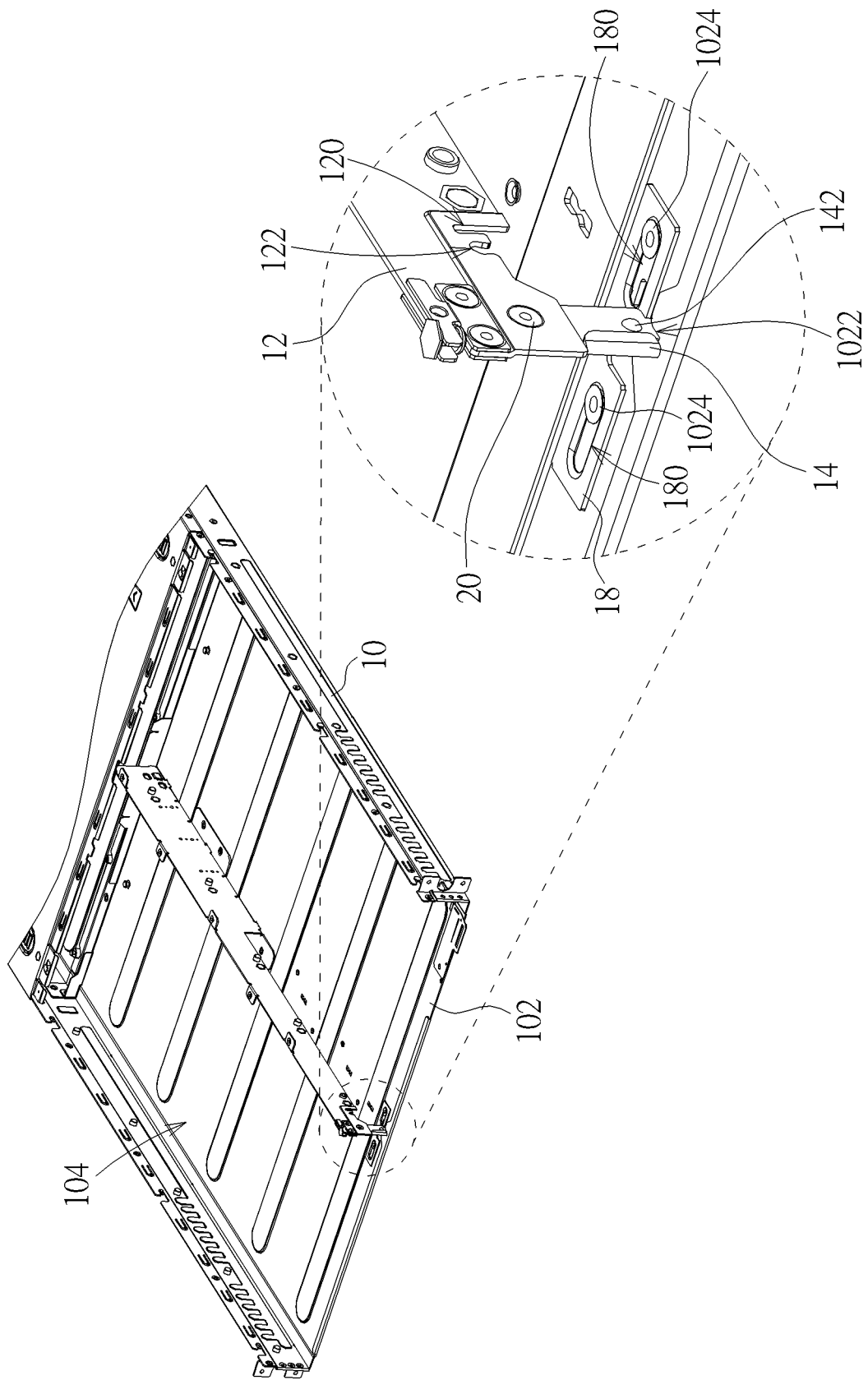
FIG. 2 is a perspective view illustrating the inside of the housing shown in FIG. 1.
Figure 4:
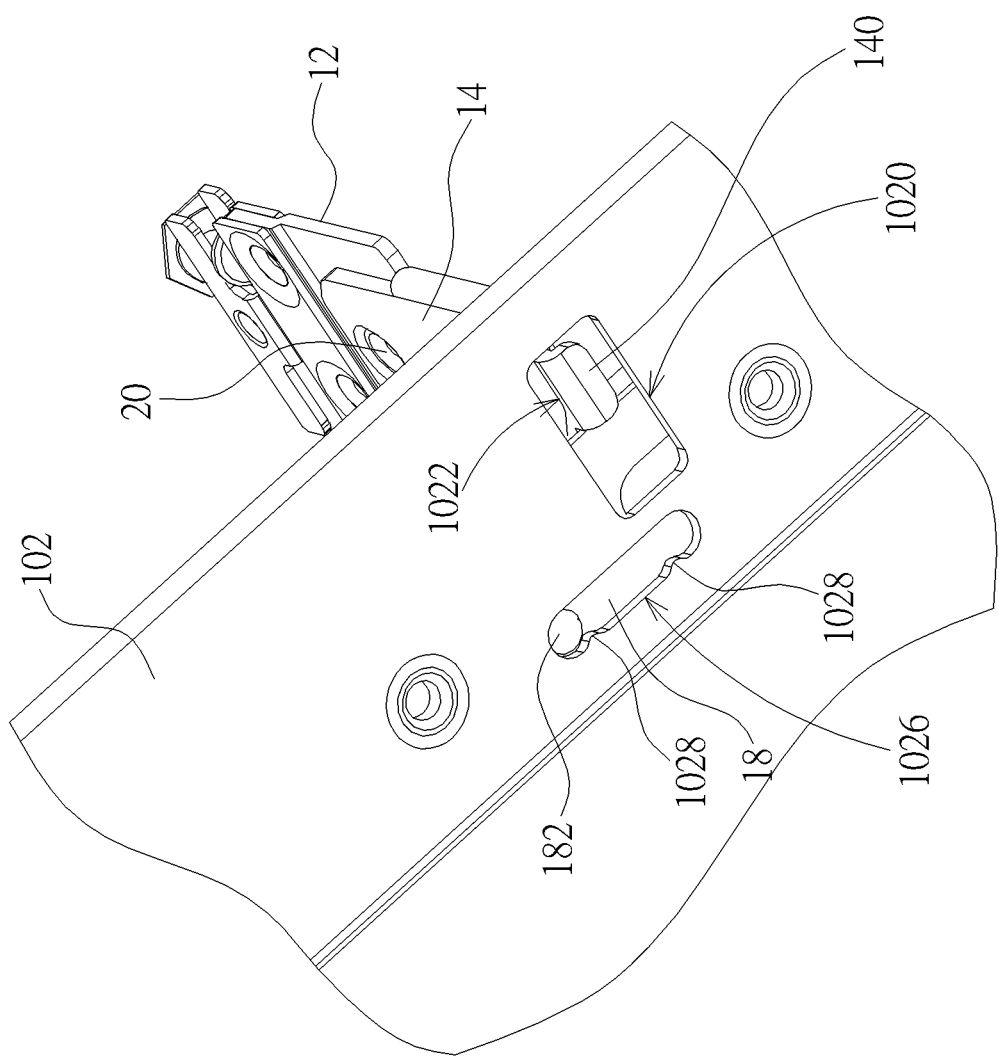
FIG. 4 is a perspective view illustrating the housing shown in FIG. 2 from another viewing angle.

The housing 10 includes a top plate 100 and a bottom plate 102, wherein the top plate 100 is opposite to the bottom plate 102. An accommodating space 104 is located between the top plate 100 and the bottom plate 102. The bottom plate 102 has a through hole 1020 (as shown in FIG. 4) and a first engaging groove 1022, wherein the first engaging groove 1022 is connected to the through hole 1020. The sliding member 18 is disposed on the bottom plate 102 and corresponds to the through hole 1020. As shown in FIG. 2, the sliding member 18 may have two guiding grooves 180 and the bottom plate 102 may have two guiding portions 1024. The two guiding portions 1024 are located in the two guiding grooves 180, respectively, such that the sliding member 18 is capable of sliding with respect to the bottom plate 102 within a length range of the guiding groove 180. It should be noted that the number of the guiding portions 1024 and the guiding grooves 180 may be determined according to practical applications, so the disclosure is not limited to the embodiment shown in the figures. Furthermore, as shown in FIG. 4, the bottom plate 102 further has a positioning groove 1026 and a bottom of the sliding member 18 has a positioning portion 182, wherein the positioning portion 182 is located in the positioning groove 1026. Each of opposite ends of the positioning groove 1026 has a protrusion 1028. The protrusion 1028 cooperates with the positioning portion 182 to position the sliding member 18.

Figure 3:
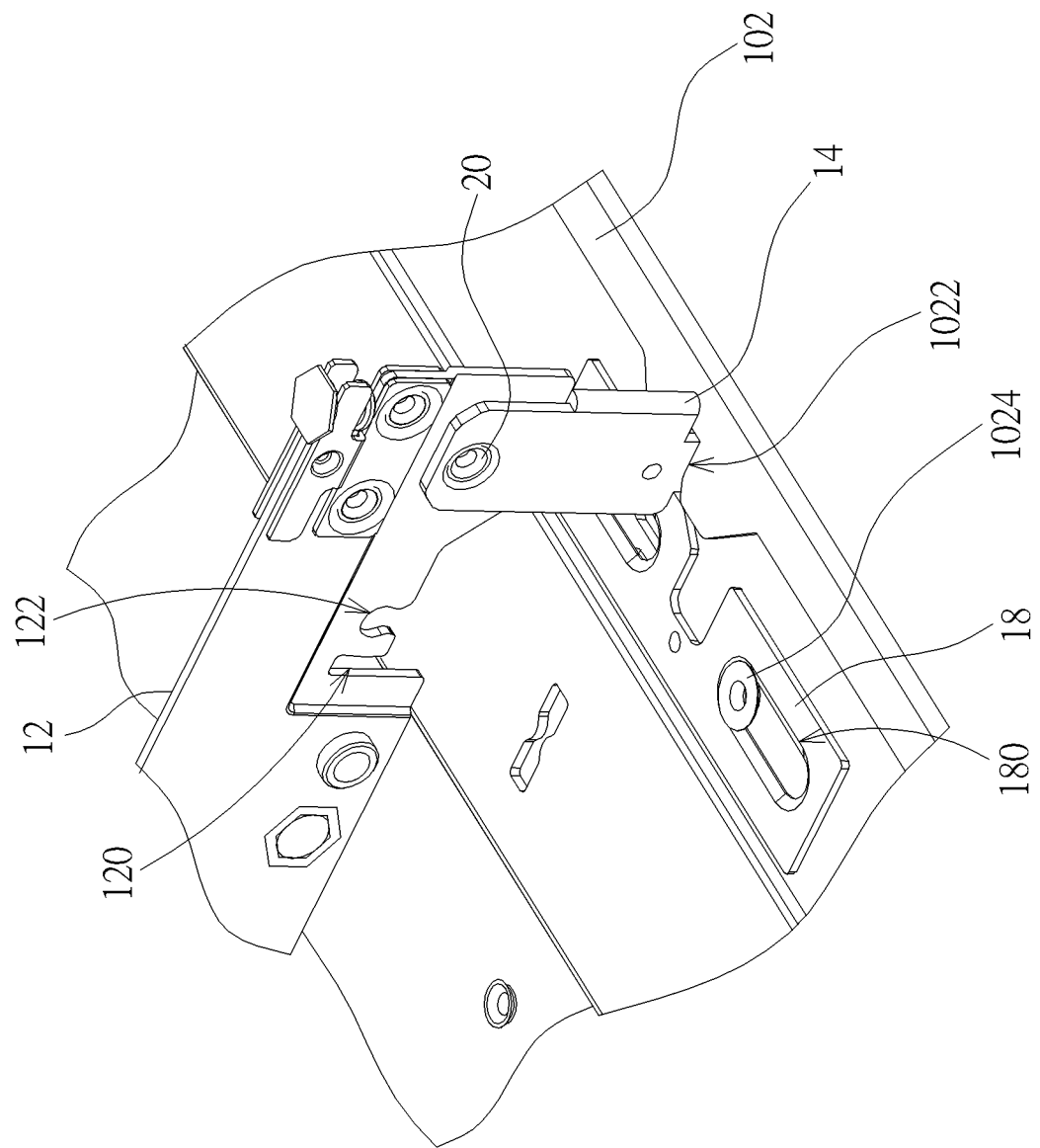
FIG. 3 is a perspective view illustrating the housing shown in FIG. 2 from another viewing angle.

The partition 12 is disposed in the accommodating space 104 and the movable member 14 is connected to the partition 12. In this embodiment, the movable member 14 may be pivotally connected to the partition 12 by a pivot 20. As shown in FIGS. 2 and 3, the partition 12 has an accommodating groove 120 and a second engaging groove 122. Furthermore, the movable member 14 has a first engaging portion 140 (as shown in FIG. 4) and a second engaging portion 142 (as shown in FIG. 2).

Figure 5:
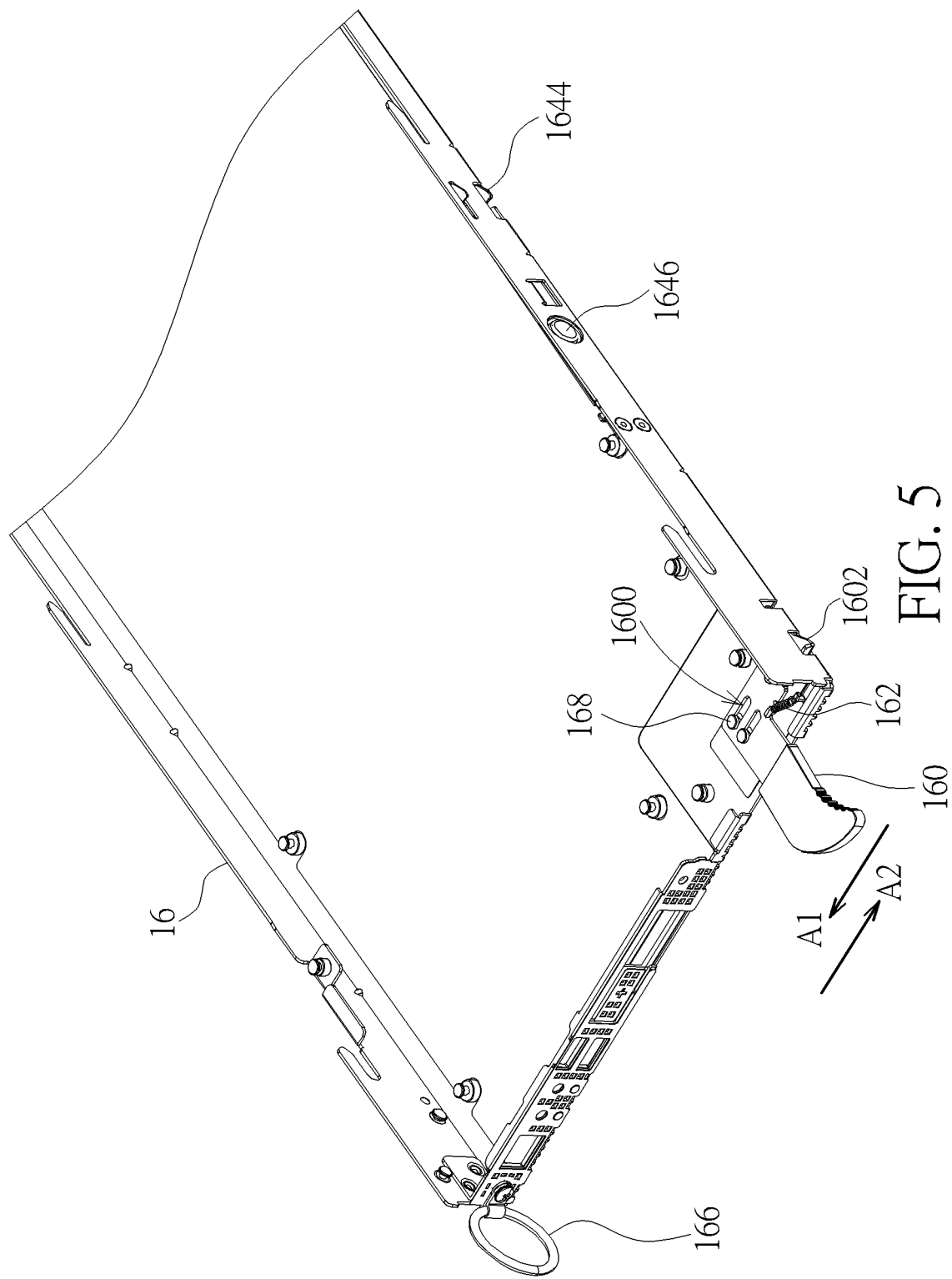
FIG. 5 is a perspective view illustrating the tray shown in FIG. 1.
Figure 6:
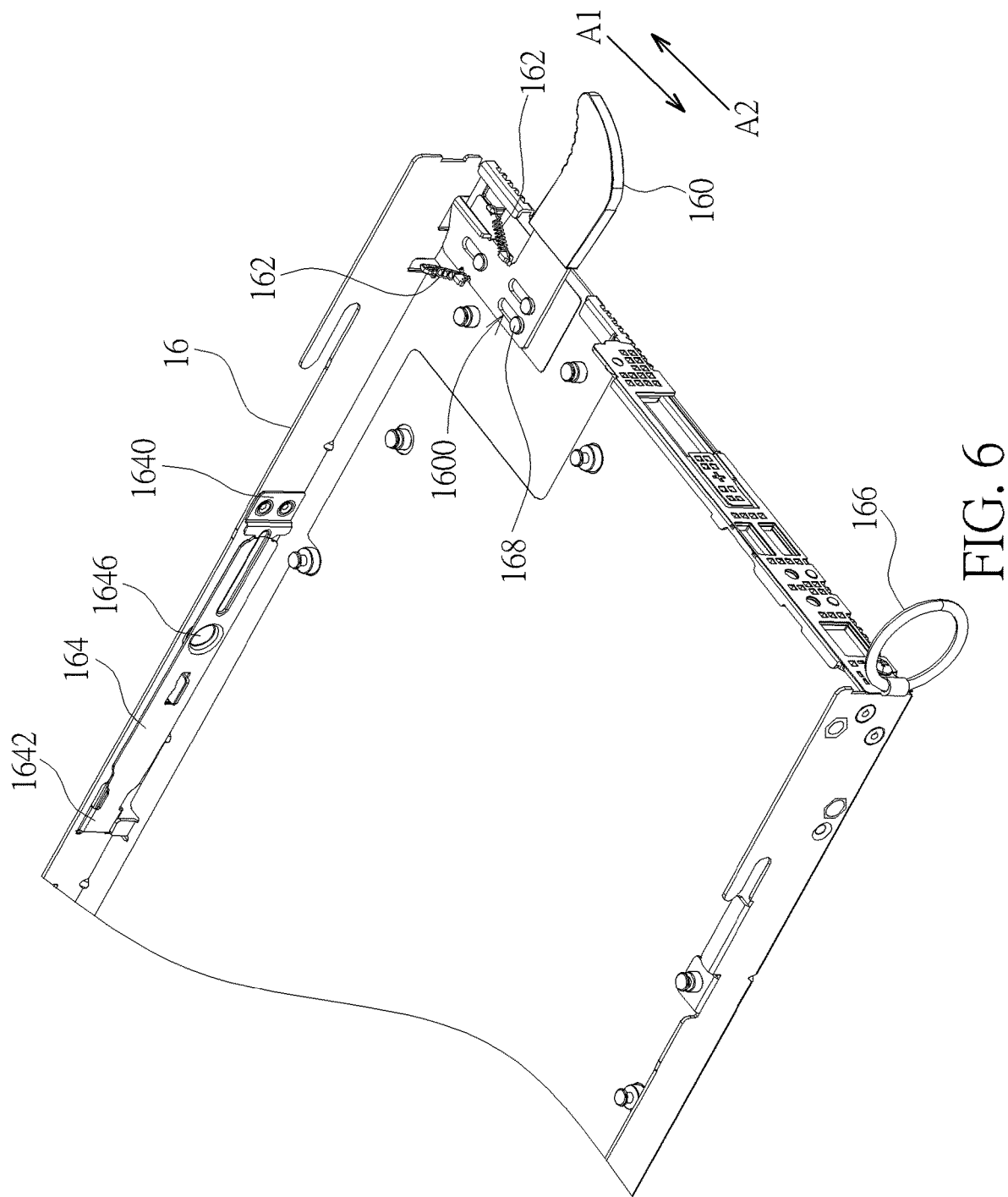
FIG. 6 is a perspective view illustrating the tray shown in FIG. 5 from another viewing angle.

As shown in FIGS. 5 and 6, the tray 16 includes a latch member 160, at least one elastic member 162, a restraining member 164 and a holding member 166. The latch member 160 may have three guiding grooves 1600 and the tray 16 may have three guiding portions 168. The three guiding portions 168 are located in the three guiding grooves 1600, respectively, such that the latch member 160 is capable of moving with respect to the tray 16 within a length range of the guiding groove 1600. It should be noted that the number of the guiding portions 168 and the guiding grooves 1600 may be determined according to practical applications, so the disclosure is not limited to the embodiment shown in the figures. The elastic member 162 is connected to the latch member 160. In this embodiment, two elastic members 162 are connected to opposite sides of the latch member 160, respectively. Still further, a latch end 1602 of the latch member 160 is exposed from the tray 16. A user may pull the latch member 160 along a direction of an arrow A1, such that the latch end 1602 is retracted into the tray 16 and the elastic member 162 is stretched. When the latch member 160 is released, an elastic force generated by the elastic member 162 drives the latch member 160 to return to original position along a direction of an arrow A2. In this embodiment, the elastic member 162 may be a spring.

A fixing end 1640 of the restraining member 164 is fixed on a side of the tray 16 and a free end 1642 of the restraining member 164 has a restraining portion 1644, wherein the fixing end 1640 and the free end 1642 are located at opposite sides of the restraining member 164. The restraining member 164 further has a press portion 1646, wherein the press portion 1646 is located between the fixing end 1640 and the free end 1642. Furthermore, the restraining portion 1644 and the press portion 1646 both are exposed from the tray 16. In this embodiment, the restraining member 164 may be a metal elastic plate. Accordingly, the user may press the press portion 1646 of the restraining member 164 to deform the restraining member 164 elastically, so as to drive the restraining portion 1644 to move. When the press portion 1646 of the restraining member 164 is released, an elastic force generated by the restraining member 164 drives the press portion 1646 and the restraining portion 1644 to return to original position.

Figure 9:
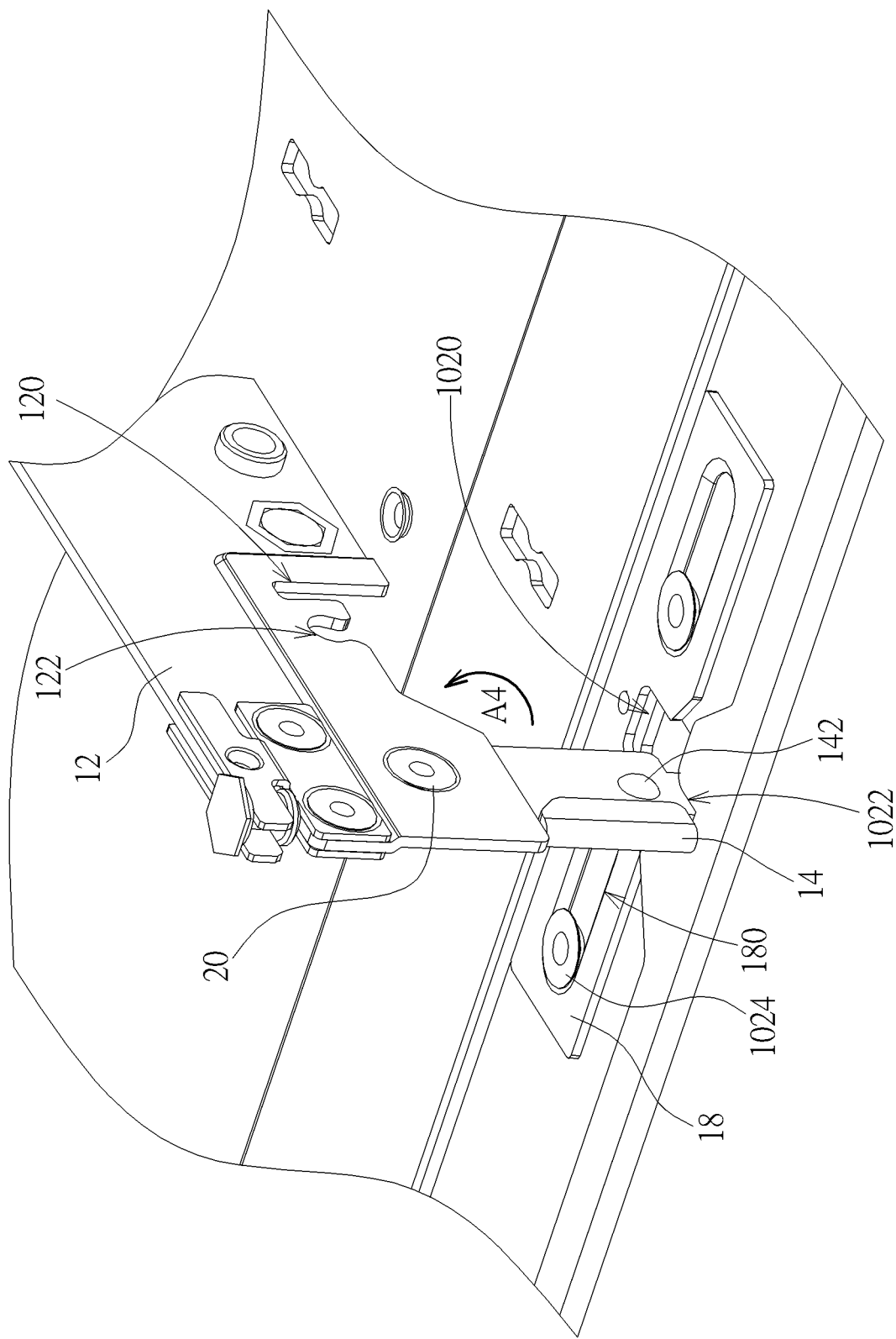
FIG. 9 is a perspective view illustrating the sliding member shown in FIG. 2 after sliding.
Figure 10:
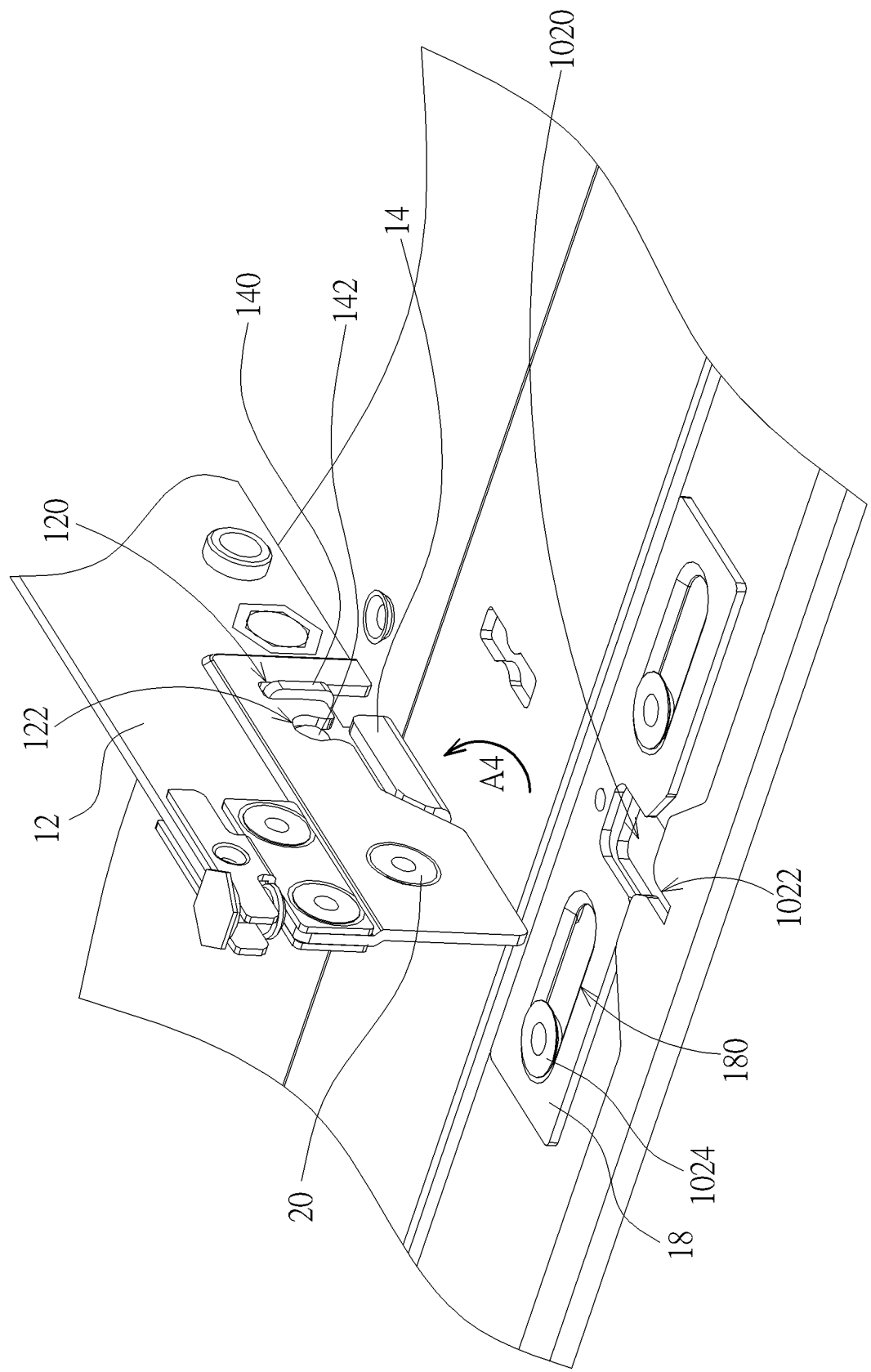
FIG. 10 is a perspective view illustrating the movable member shown in FIG. 9 after moving.

In this embodiment, the movable member 14 is capable of moving between a first position (as shown in FIGS. 1 to 4) and a second position (as shown in FIG. 10), and the sliding member 18 is capable of sliding between a third position (as shown in FIGS. 1 to 4) and a fourth position (as shown in FIGS. 9 and 10).

As shown in FIGS. 2 to 4, when the movable member 14 is located at the first position, the movable member 14 is embedded into the through hole 1020 of the bottom plate 102 and the first engaging portion 140 of the movable member 14 engages with the first engaging groove 1022 of the bottom plate 102. Furthermore, when the movable member 14 is located at the first position and the sliding member 18 is located at the third position, the sliding member 18 abuts against the movable member 14 (as shown in FIGS. 2 and 3) to restrain the movable member 14 at the first position. Accordingly, the movable member 14 divides the accommodating space 104 into two smaller spaces for accommodating two trays 16.

Figure 7:
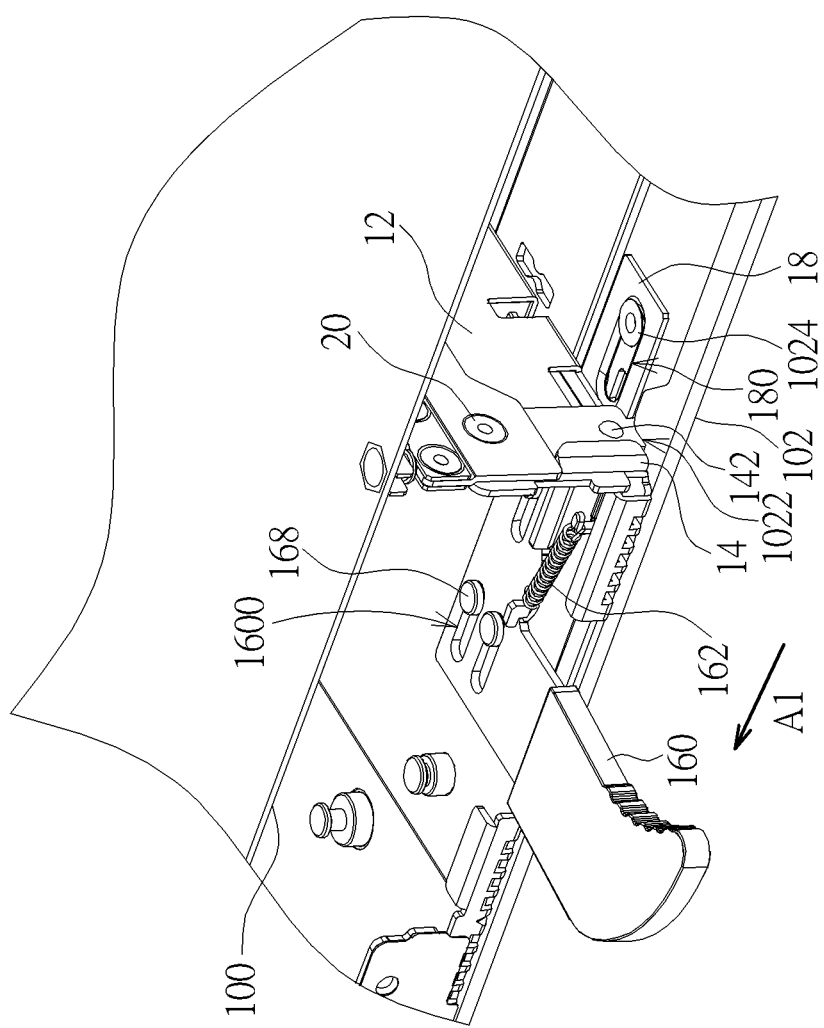
FIG. 7 is a perspective view illustrating the latch member shown in FIG. 1 after being pulled.
Figure 8:
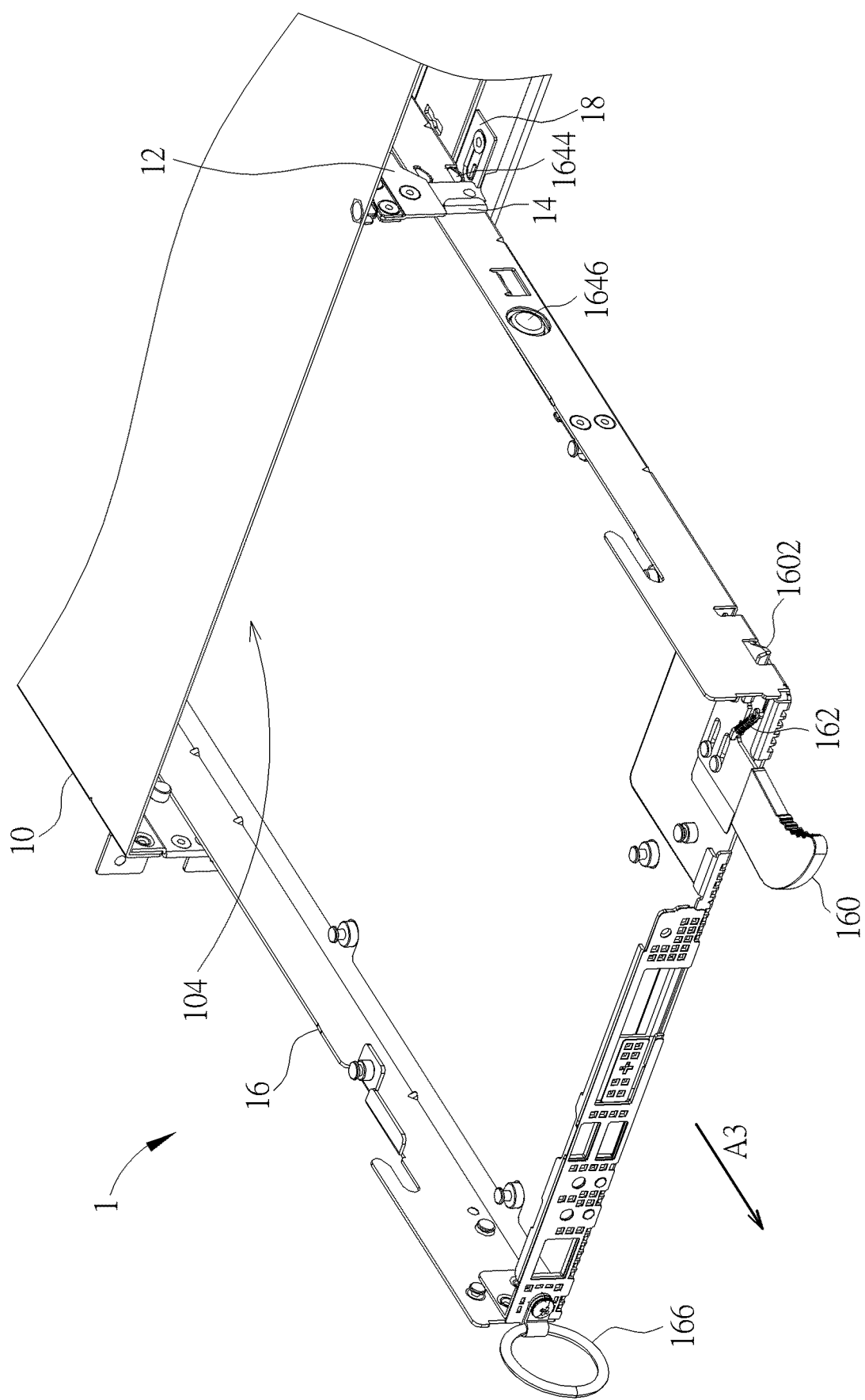
FIG. 8 is a perspective view illustrating the tray shown in FIG. 1 being drawn out of the accommodating space by a predetermined distance.

As shown in FIG. 1, when the movable member 14 is located at the first position, the user may place the tray 16 into the accommodating space 104. At this time, the latch end 1602 of the latch member 160 engages with the movable member 14, such that the tray 16 is fixed in the housing 10. When the user wants to take the tray 16 out of the housing 10, the user may pull the latch member 160 along the direction of the arrow A1 to a position shown in FIG. 7, such that the latch end 1602 of the latch member 160 disengages from the movable member 14. Then, as shown in FIG. 8, the user may pull the latch member 160 and the holding member 166 along a direction of an arrow A3 to draw the tray 16 out of the accommodating space 104. In this embodiment, the holding member 166 may be rotatable to facilitate the operation for the user. In one example, the holding member 166 may rotate by 360 degrees. In another embodiment, the holding member 166 may be omitted. In other words, the user may pull the latch member 160 along the direction of the arrow A3 directly after pulling the latch member 160 along the direction of the arrow A1, so as to draw the tray 16 out of the accommodating space 104.

Since the movable member 14 is still located at the first position, the restraining portion 1644 of the restraining member 164 engages with the movable member 14 while the tray 16 is drawn out of the accommodating space 104 by a predetermined distance, such that the tray 16 may be restrained at a position shown in FIG. 8. Accordingly, the disclosure can prevent the tray 16 from being drawn out directly and then falling. When the tray 16 is restrained at the position shown in FIG. 8, the user may press the press portion 1646 of the restraining member 164. When the press portion 1646 is pressed, the restraining portion 1644 of the restraining member 164 disengages from the movable member 14. At this time, the user can take the tray 16 out of the housing 10.

After taking the tray 16 out of the housing 10, the user may operate the movable member 14 to move from the first position shown in FIG. 2 to the second position shown in FIG. 10, such that a larger tray may be accommodated in the accommodating space 104. First, the user has to slide the sliding member 18 from the third position shown in FIG. 2 to the fourth position shown in FIG. 9. When the sliding member 18 is located at the fourth position shown in FIG. 9, the sliding member 18 disengages from the movable member 14. At this time, the user may push the movable member 14 along a direction of an arrow A4, such that the first engaging portion 140 of the movable member 14 disengages from the first engaging groove 1022 and the through hole 1020, and then moves from the first position shown in FIG. 9 to the second position shown in FIG. 10. As shown in FIG. 10, when the movable member 14 is located at the second position, the first engaging portion 140 is accommodated in the accommodating groove 120 of the partition 12 and the second engaging portion 142 engages with the second engaging groove 122 of the partition 12, such that the movable member 14 is fixed on the partition 12.

It should be noted that the user may also operate the movable member 14 and the sliding member 18 shown in FIG. 10 inversely according to the aforesaid manner to move the movable member 14 and the sliding member 18 to the first position and the third position shown in FIG. 2, respectively, so as to divide the accommodating space 104 into two smaller spaces.

Figure 11:
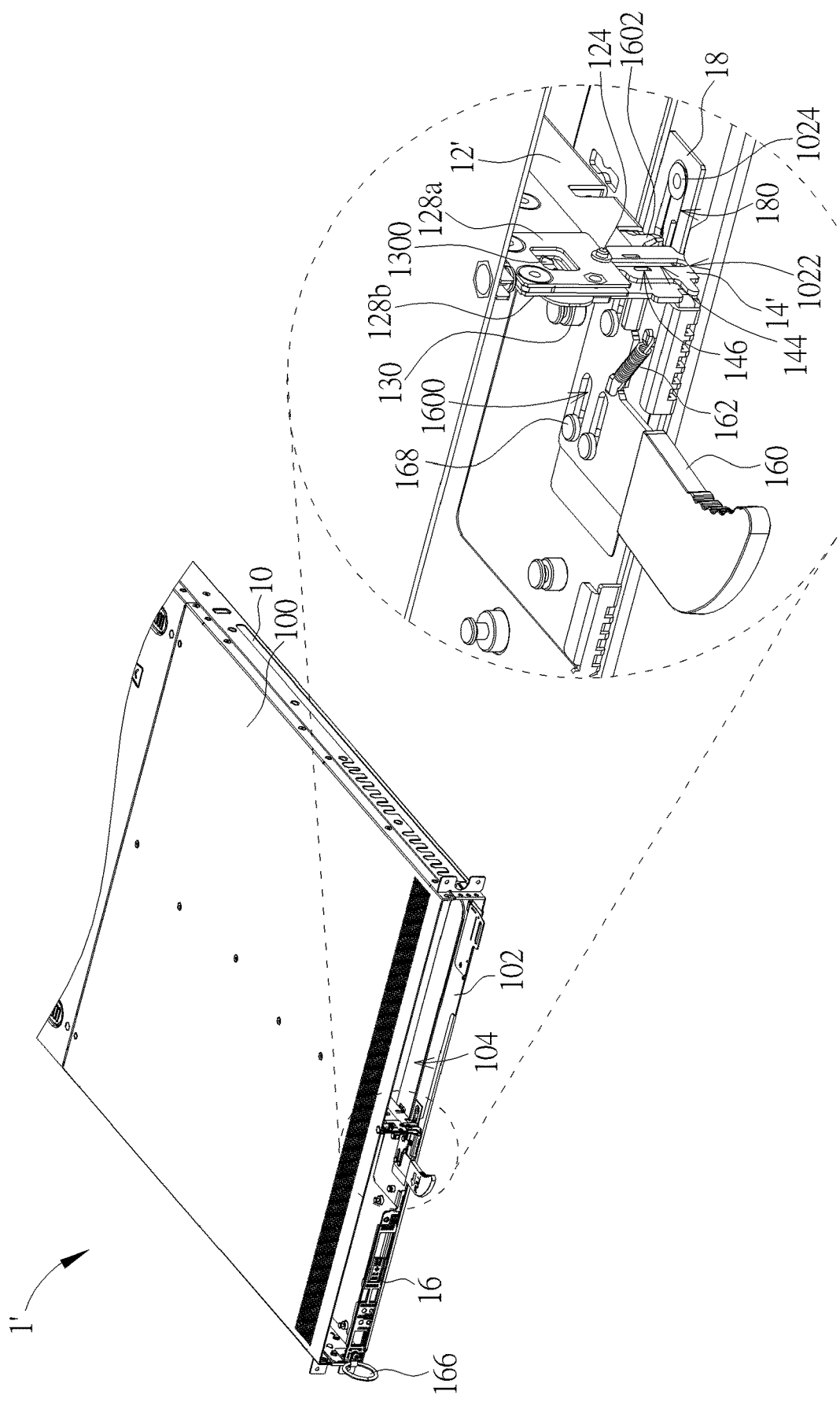
FIG. 11 is a perspective view illustrating a chassis according to another embodiment of the disclosure.

Referring to FIG. 11, a partition 12' and a movable member 14' of a chassis 1' shown in FIG. 11 are different from the partition 12 and the movable member 14 mentioned in the above. The structure and principle of the housing 10, the tray 16 and the sliding member 18 have been mentioned in the above, so the repeated explanation will not be depicted herein again.

As shown in FIGS. 12 to 18, the partition 12' includes a pivot 124, two guiding portions 126, two support members 128a, 128b and a positioning member 130. It should be noted that the support member 128a is removed from FIGS. 15 to 18 for purpose of illustration. The pivot 124 and the two guiding portions 126 are disposed between the two support members 128a, 128b, and the two guiding portions 126 are located at opposite sides of the pivot 124. The movable member 14' has a sliding groove 144. The pivot 124 is disposed in the sliding groove 144, such that the movable member 14' is sandwiched in between the two support members 128a, 128b. Furthermore, the positioning member 130 has at least one positioning portion 1300 and the movable member 14' has a t least one positioning groove 146, wherein the positioning groove 146 corresponds to the positioning portion 1300. In this embodiment, the positioning member 130 may have, but not limited to, two positioning portions 1300 and the movable member 14' may have, but not limited to, two positioning grooves 146.

Figure 12:
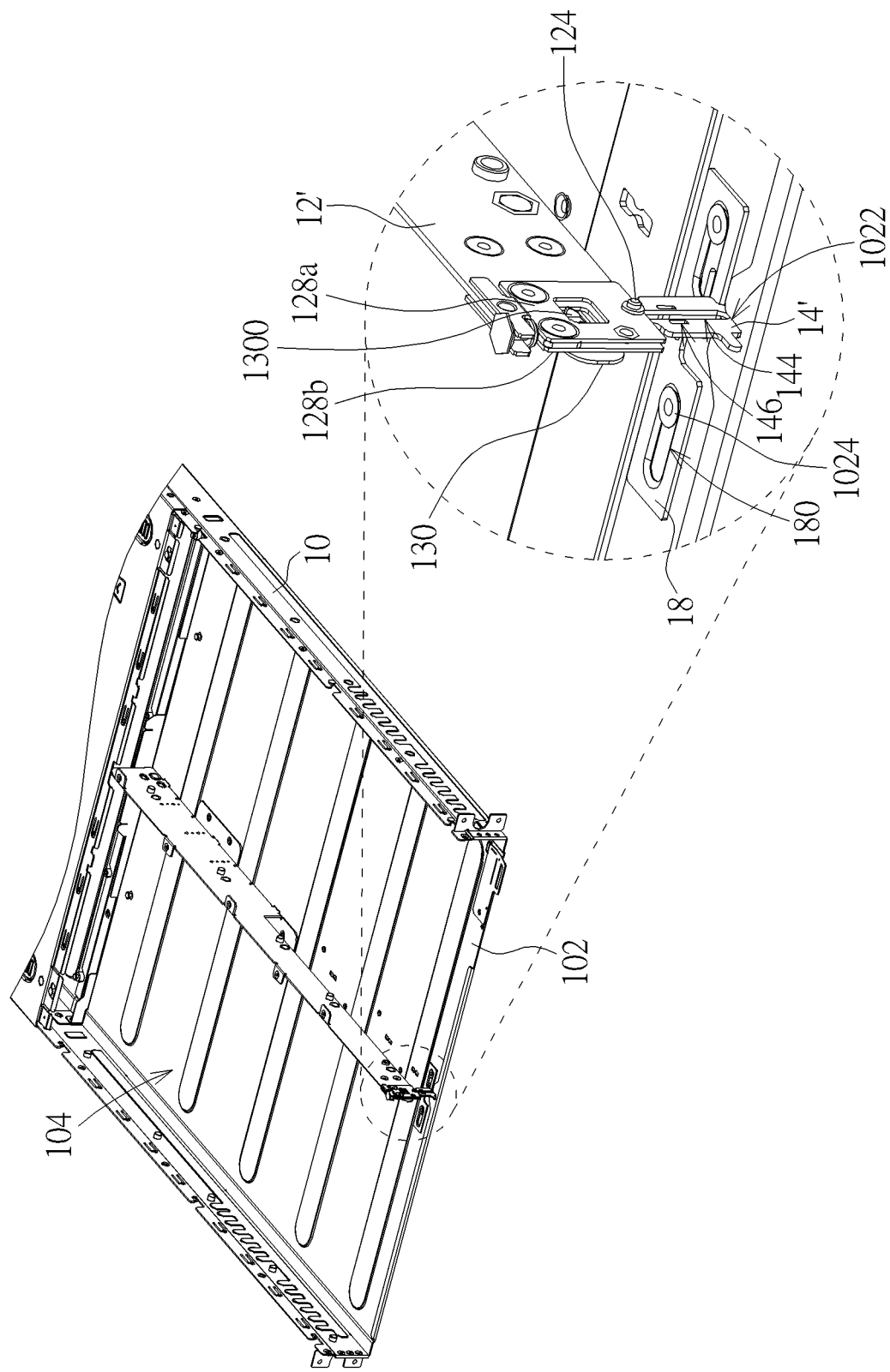
FIG. 12 is a perspective view illustrating the inside of the housing shown in FIG. 11.
Figure 13:
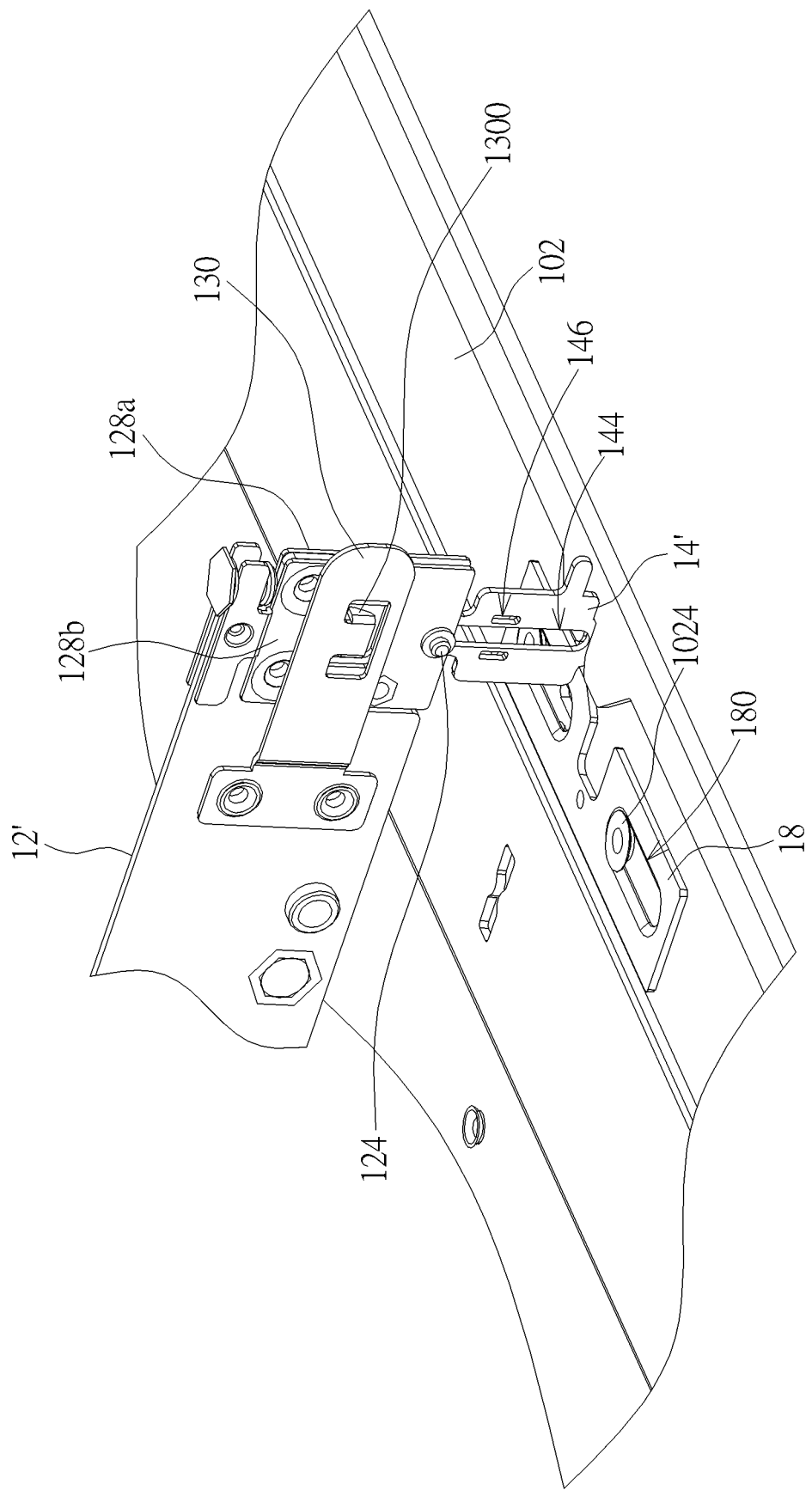
FIG. 13 is a perspective view illustrating the housing shown in FIG. 12 from another viewing angle.
Figure 14:
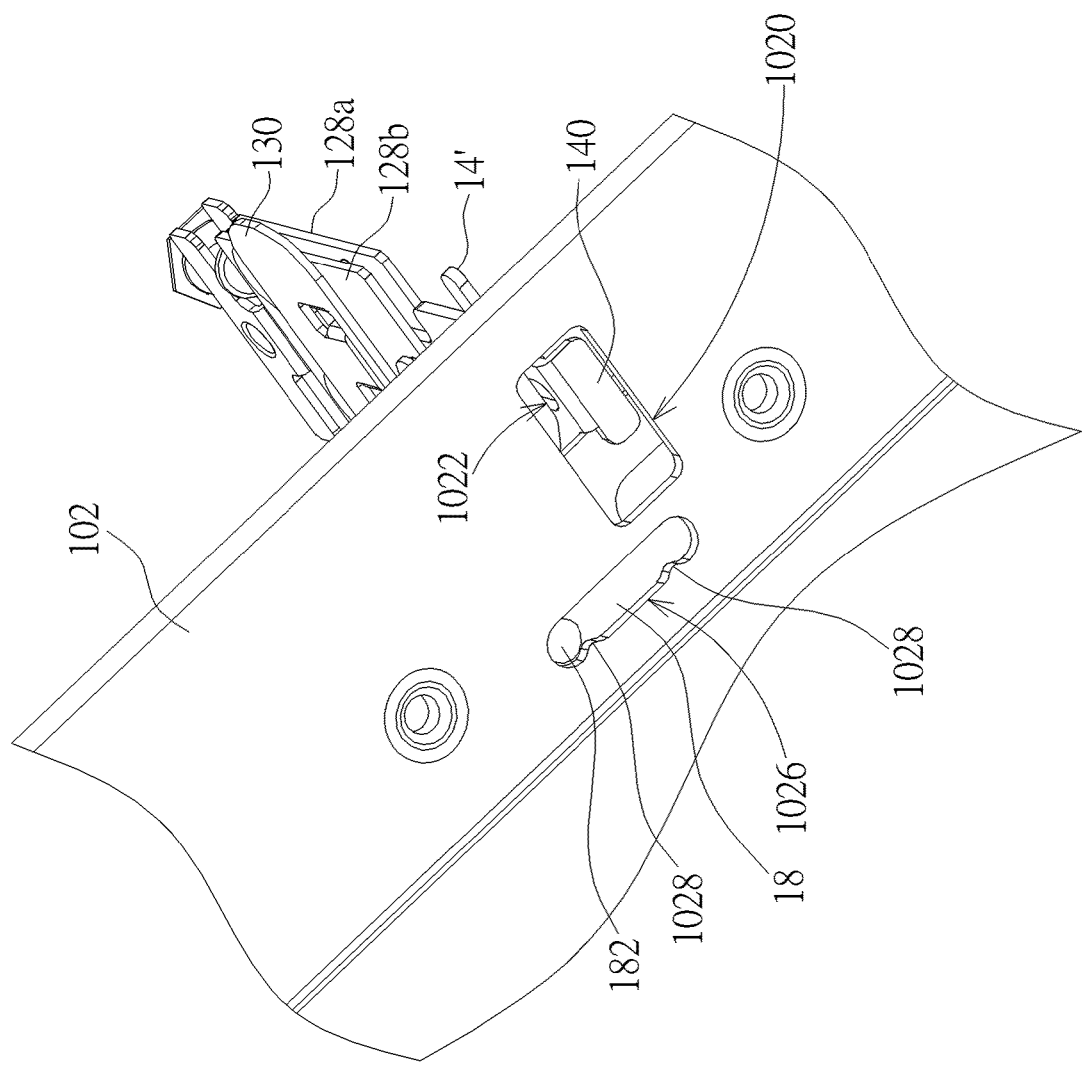
FIG. 14 is a perspective view illustrating the housing shown in FIG. 12 from another viewing angle.
Figure 15:
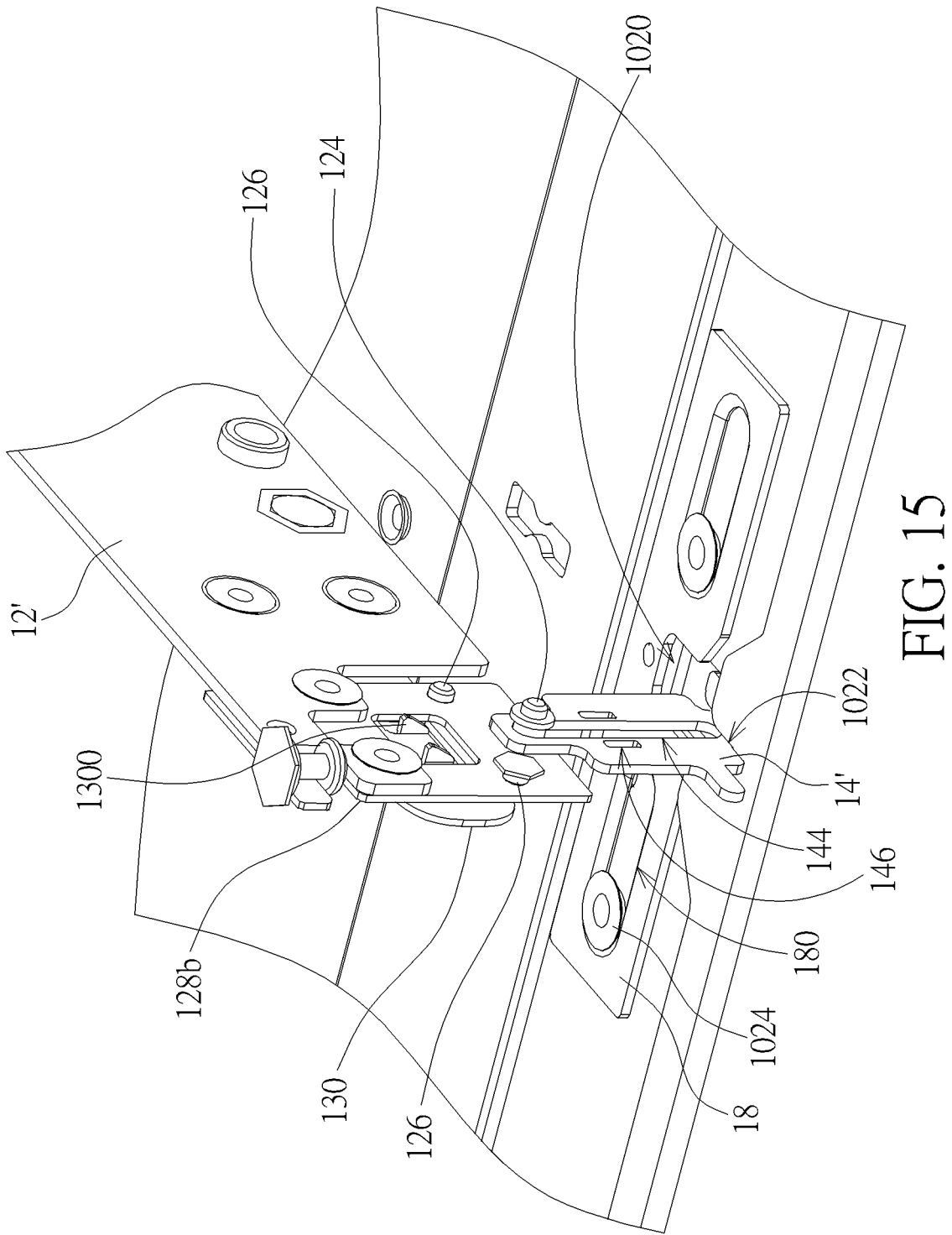
FIG. 15 is a perspective view illustrating the sliding member shown in FIG. 12 after sliding.

In this embodiment, the movable member 14' is capable of moving between a first position (as shown in FIGS. 11 to 15) and a second position (as shown in FIG. 18), and the sliding member 18 is capable of sliding between a third position (as shown in FIGS. 11 to 13) and a fourth position (as shown in FIGS. 15 and 18).

As shown in FIGS. 12 to 14, when the movable member 14' is located at the first position, the movable member 14' is embedded into the through hole 1020 of the bottom plate 102 and the first engaging portion 140 of the movable member 14' engages with the first engaging groove 1022 of the bottom plate 102. Furthermore, when the movable member 14' is located at the first position and the sliding member 18 is located at the third position, the sliding member 18 abuts against the movable member 14' (as shown in FIGS. 12 and 13) to restrain the movable member 14' at the first position. Accordingly, the movable member 14' divides the accommodating space 104 into two smaller spaces for accommodating two trays 16. The details of how to position the sliding member 18 have been mentioned in the above, so the repeated explanation will not be depicted herein again.

As shown in FIG. 11, when the movable member 14' is located at the first position, the user may place the tray 16 into the accommodating space 104. At this time, the latch end 1602 of the latch member 160 engages with the movable member 14', such that the tray 16 is fixed in the housing 10. When the user wants to take the tray 16 out of the housing 10, the operation is identical to that mentioned in the above, so the repeated explanation will not be depicted herein again.

Figure 16:
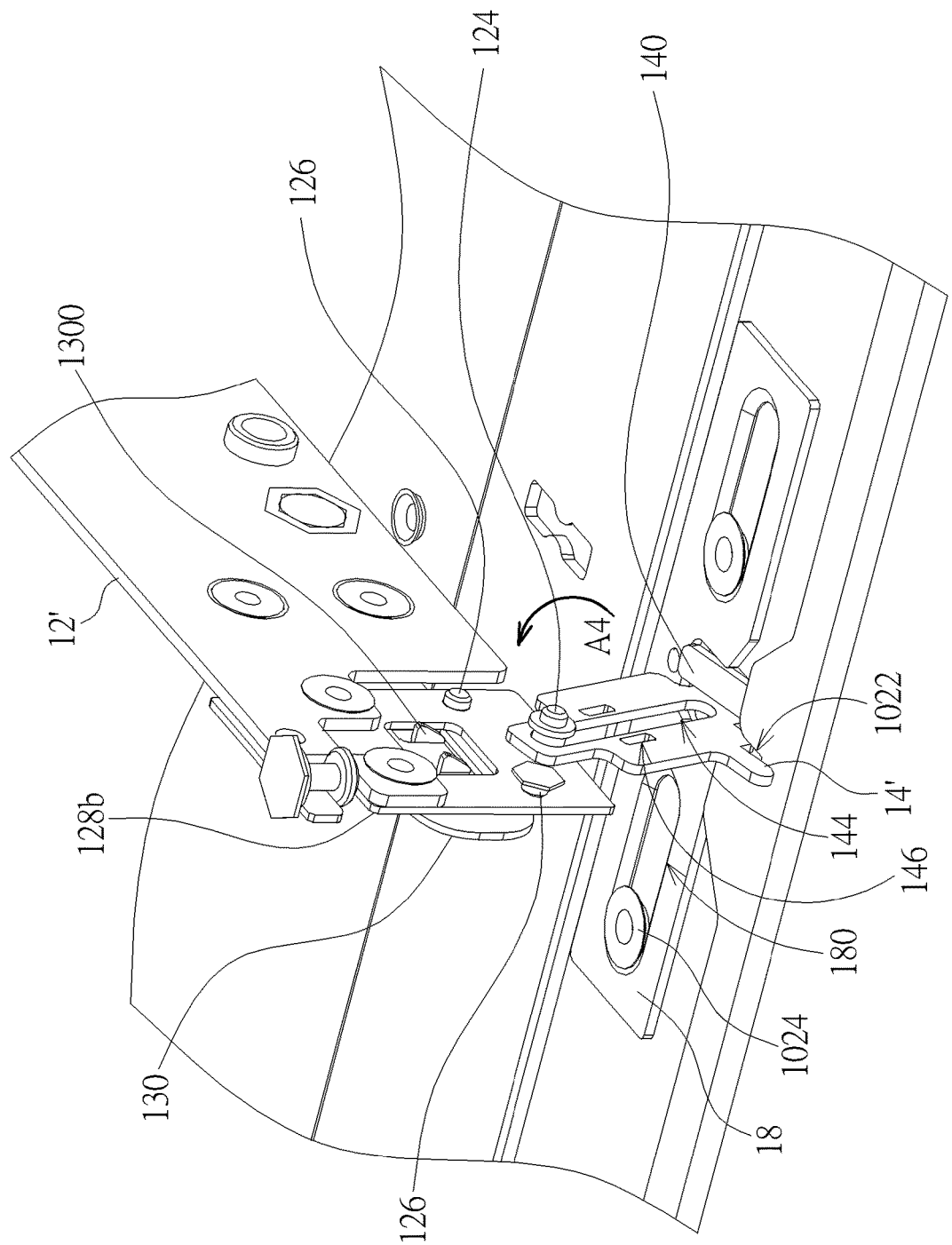
FIG. 16 is a perspective view illustrating the movable member shown in FIG. 15 after rotating.
Figure 17:
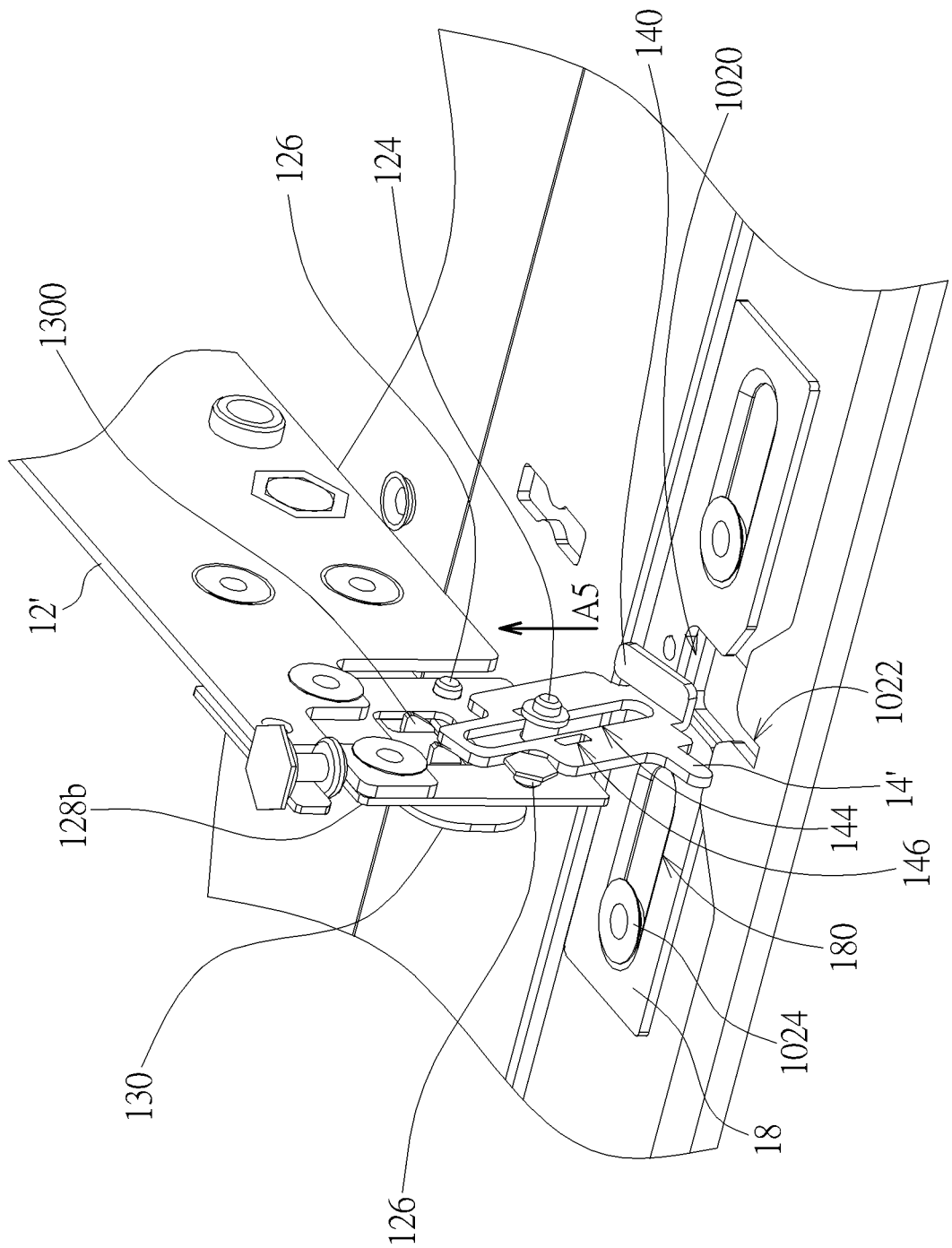
FIG. 17 is a perspective view illustrating the movable member shown in FIG. 16 after moving.

Furthermore, the user may operate the movable member 14' to move from the first position shown in FIG. 12 to the second position shown in FIG. 18, such that a larger tray may be accommodated in the accommodating space 104. First, the user has to slide the sliding member 18 from the third position shown in FIG. 12 to the fourth position shown in FIG. 15. When the sliding member 18 is located at the fourth position shown in FIG. 15, the sliding member 18 disengages from the movable member 14'. At this time, the user may push the movable member 14' along the direction of the arrow A4, such that the first engaging portion 140 of the movable member 14' disengages from the first engaging groove 1022, as shown in FIG. 16. Then, the user may push the movable member 14' along a direction of an arrow A5, such that the pivot 124 moves within the sliding groove 144. At this time, the movable member 14' disengages from the through hole 1020, as shown in FIG. 17. When the user pushes the movable member 14' along the direction of the arrow A5 continuously, the two guiding portions 126 guides the movable member 14' to move along the direction of the arrow A5, such that the movable member 14' moves to the second position shown in FIG. 18. In other words, when the movable member 14' moves from the first position shown in FIG. 12 to the second position shown in FIG. 18, the pivot 124 moves within the sliding groove 144 of the movable member 14' and the two guiding portions 126 guides the movable member 14' to move along a direction away from the bottom plate 102 (e.g. the direction of the arrow A5). As shown in FIG. 18, when the movable member 14' is located at the second position, the positioning portions 1300 of the positioning member 130 engage with the positioning grooves 146 of the movable member 14', such that the movable member 14' is fixed on the partition 12'.

It should be noted that the user may push the positioning member 130 shown in FIG. 18 along a direction of an arrow A6, such that the positioning portions 1300 of the positioning member 130 disengage from the positioning grooves 146 of the movable member 14'. Then, the user may operate the movable member 14' and the sliding member 18 shown in FIG. 18 inversely according to the aforesaid manner to move the movable member 14' and the sliding member 18 to the first position and the third position shown in FIG. 12, respectively, so as to divide the accommodating space 104 into two smaller spaces.

As mentioned in the above, a user may move the movable member to the first position to reduce the accommodating space, so as to accommodate a tray with a small size. At this time, the tray may be fixed in the accommodating space by the engagement between the movable member and the latch member of the tray. Furthermore, the user may move the moveable member to the second position to enlarge the accommodating space, so as to accommodate another tray with a large size. Since a manufacture does not need to design different chassis for different trays with different sizes, the manufacture cost can be saved effectively.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A chassis comprising:
    a housing comprising a top plate and a bottom plate, the top plate being opposite to the bottom plate, an accommodating space being located between the top plate and the bottom plate, the bottom plate having a through hole;
    a partition disposed in the accommodating space;
    a movable member connected to the partition, the movable member being configured to move between a first position and a second position to adjust a size of the accommodating space; and
    a tray comprising a latch member;

wherein when the movable member is located at the first position and the tray is placed into the accommodating space, the movable member is embedded into the through hole and the latch member engages with the movable member; when the movable member is located at the second position, the movable member disengages from the through hole.

2. The chassis of claim 1, wherein the bottom plate further has a first engaging groove, the first engaging groove is connected to the through hole, and the movable member has a first engaging portion; when the movable member is located at the first position, the first engaging portion engages with the first engaging groove.

3. The chassis of claim 2, wherein the partition has an accommodating groove; when the movable member is located at the second position, the first engaging portion is accommodated in the accommodating groove.

4. The chassis of claim 1, wherein the partition has a second engaging groove and the movable member has a second engaging portion; when the movable member is located at the second position, the second engaging portion engages with the second engaging groove.

5. The chassis of claim 1, further comprising a sliding member disposed on the bottom plate, the sliding member being capable of sliding between a third position and a fourth position; when the movable member is located at the first position and the sliding member is located at the third position, the sliding member abutting against the movable member to restrain the movable member at the first position; when the movable member is located at the first position and the sliding member is located at the fourth position, the sliding member disengaging from the movable member, such that the movable member is capable of moving from the first position to the second position.

6. The chassis of claim 1, wherein the partition comprises a pivot and two guiding portions, the two guiding portions are located at opposite sides of the pivot, the movable member has a sliding groove, and the pivot is disposed in the sliding groove; when the movable member moves from the first position to the second position, the pivot slides within the sliding groove and the two guiding portions guides the movable member to move along a direction away from the bottom plate.

7. The chassis of claim 6, wherein the partition further comprises two support members, and the pivot and the two guiding portions are disposed between the two support members.

8. The chassis of claim 6, wherein the partition further comprises a positioning member, the positioning member has at least one positioning portion, and the movable member has at least one positioning grooves; when the movable member is located at the second position, the at least one positioning portion engages with the at least one positioning groove.

9. The chassis of claim 1, wherein the tray further comprises a restraining member; when the movable member is located at the first position and the tray is drawn out of the accommodating space by a predetermined distance, the restraining member engages with the movable member.

10. The chassis of claim 9, wherein the restraining member has a press portion and the press portion is exposed from the tray; when the press portion is pressed, the restraining member disengages from the movable member.

* * * * *